(12) United States Patent
Reitlinger et al.

(10) Patent No.: US 9,386,734 B2
(45) Date of Patent: Jul. 5, 2016

(54) METHOD FOR PRODUCING A PLURALITY OF ELECTRONIC DEVICES

(75) Inventors: Claus Reitlinger, Wolnzach (DE); Gerhard Zeller, Munich (DE)

(73) Assignee: EPCOS AG, Munich (DE)

( * ) Notice: Subject to any disclaimer, the term of this patent is extended or adjusted under 35 U.S.C. 154(b) by 436 days.

(21) Appl. No.: 13/814,225

(22) PCT Filed: Jul. 27, 2011

(86) PCT No.: PCT/EP2011/062919
§ 371 (c)(1),
(2), (4) Date: Mar. 15, 2013

(87) PCT Pub. No.: WO2012/016898
PCT Pub. Date: Feb. 9, 2012

(65) Prior Publication Data
US 2013/0170172 A1 Jul. 4, 2013

(30) Foreign Application Priority Data

Aug. 5, 2010 (DE) .......................... 10 2010 033 551
Oct. 15, 2010 (DE) .......................... 10 2010 048 632

(51) Int. Cl.
*H05K 3/36* (2006.01)
*H05K 9/00* (2006.01)
(Continued)

(52) U.S. Cl.
CPC ............ *H05K 9/0024* (2013.01); *H01L 23/552* (2013.01); *H05K 1/0204* (2013.01); *H05K 3/22* (2013.01); *H05K 9/003* (2013.01); *H01L 24/73* (2013.01); *H01L 2224/16225* (2013.01); *H01L 2224/32225* (2013.01); *H01L 2224/48227* (2013.01); *H01L 2224/73265* (2013.01); *H01L 2924/1815* (2013.01); *H01L 2924/19107* (2013.01); *H01L 2924/3025* (2013.01); *H01L 2924/30107* (2013.01); *Y10T 29/49124* (2015.01)

(58) Field of Classification Search
USPC .......................... 29/417, 830, 885; 156/196
See application file for complete search history.

(56) References Cited

U.S. PATENT DOCUMENTS 7,451,539 B2    11/2008   Morris et al.
7,576,415 B2 *   8/2009   Cha et al. ..................... 257/659
(Continued)

FOREIGN PATENT DOCUMENTS

DE            44 36 903 A1    4/1996
DE   10 2005 053 765 A1    5/2007
(Continued)

*Primary Examiner* — Paul D Kim
(74) *Attorney, Agent, or Firm* — McDermott Will & Emery LLP

(57) ABSTRACT

An electronic device comprises a substrate (120), at least one electronic component (171, 172, 173) arranged on the substrate, and an encapsulation (140) covering the at least one electronic component (171, 172, 173). An electromagnetic protective layer (130) covers a surface (143) of the encapsulation (140) that faces away from the substrate (120), and the side faces (121, 141; 122, 142) directed transversely with respect to the surface (143). In particular, a thermal and/or electrical coupling (134, 162, 163, 164, 165, 166) couples the electromagnetic protective layer (130) thermally and/or electrically to a region (168) of the electronic device (111, 112) that is enclosed by the encapsulation. For production purposes, the device is singulated from a panel and the electromagnetic protective layer (130) is subsequently applied.

6 Claims, 8 Drawing Sheets

(51) Int. Cl.
  *H01L 23/552* (2006.01)
  *H05K 1/02* (2006.01)
  *H05K 3/22* (2006.01)
  *H01L 23/00* (2006.01)

(56) References Cited

U.S. PATENT DOCUMENTS

| | | | |
|---|---|---|---|
| 7,651,889 B2 | 1/2010 | Tang et al. | |
| 7,656,047 B2 | 2/2010 | Yang et al. | |
| 7,700,411 B2 | 4/2010 | Yang et al. | |
| 7,989,928 B2 * | 8/2011 | Liao et al. | 257/659 |
| 8,093,690 B2 * | 1/2012 | Ko et al. | 257/660 |
| 8,212,340 B2 * | 7/2012 | Liao | 257/660 |
| 8,368,185 B2 * | 2/2013 | Lee et al. | 257/659 |
| 8,653,634 B2 * | 2/2014 | Chiu et al. | 257/659 |
| 2004/0252475 A1 | 12/2004 | Tsuneoka et al. | |
| 2005/0067676 A1 | 3/2005 | Mahadevan et al. | |
| 2007/0030661 A1 | 2/2007 | Morris et al. | |
| 2007/0062637 A1 | 3/2007 | Sjoedin | |
| 2007/0145539 A1 | 6/2007 | Lam | |
| 2008/0019112 A1 | 1/2008 | Hatanaka et al. | |
| 2008/0265383 A1 | 10/2008 | Brunnbauer et al. | |
| 2009/0001553 A1 | 1/2009 | Pahl et al. | |
| 2009/0071710 A1 | 3/2009 | Stelzl et al. | |
| 2009/0194852 A1 | 8/2009 | Chiu et al. | |
| 2009/0315156 A1 | 12/2009 | Harper | |
| 2010/0006988 A1 | 1/2010 | Tang et al. | |
| 2010/0019359 A1 | 1/2010 | Pagaila et al. | |
| 2010/0020518 A1 | 1/2010 | Bustamante | |
| 2010/0032815 A1 | 2/2010 | An et al. | |
| 2010/0127377 A1 | 5/2010 | Bauer et al. | |
| 2010/0172116 A1 | 7/2010 | Yorita et al. | |

FOREIGN PATENT DOCUMENTS

| | | |
|---|---|---|
| DE | 102006025162 B3 | 1/2008 |
| DE | 10 2007 020 656 A1 | 11/2008 |
| DE | 102007025992 A1 | 12/2008 |
| DE | 10 2007 035 181 A1 | 1/2009 |
| EP | 2 133 916 A2 | 12/2009 |
| JP | 2004-095607 A | 3/2004 |
| JP | 2004-172176 A | 6/2004 |
| JP | 2007-335619 A | 12/2007 |
| JP | 2008-258478 A | 10/2008 |
| JP | 2009-071083 A | 4/2009 |
| JP | 2011-159786 A | 8/2011 |
| WO | WO-2010/047007 A1 | 4/2010 |

\* cited by examiner

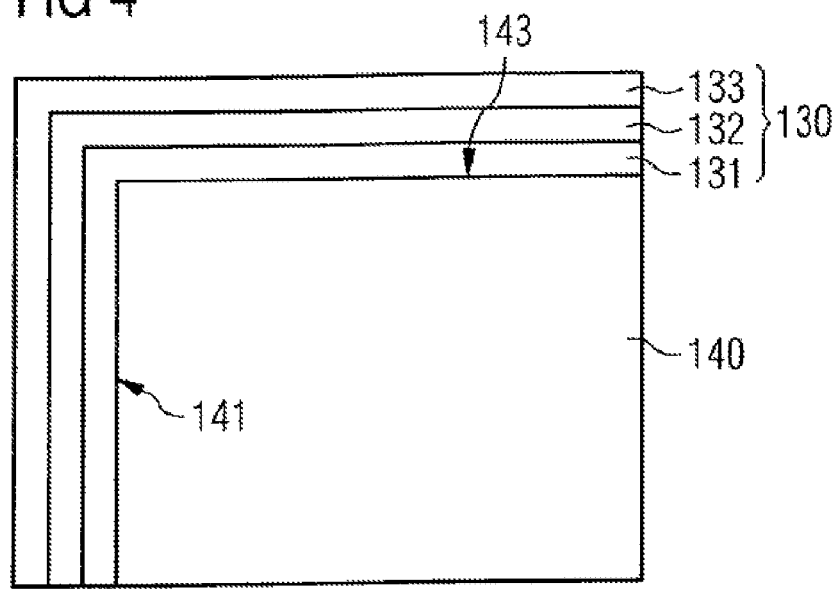
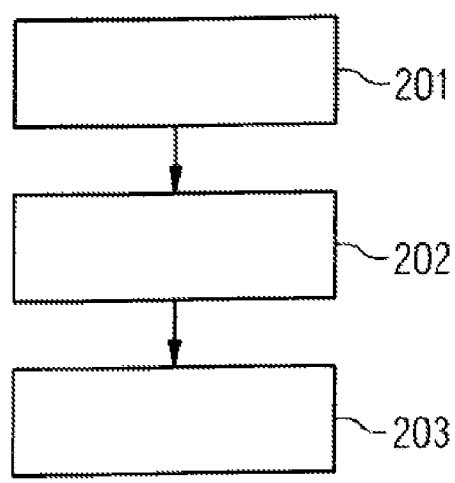

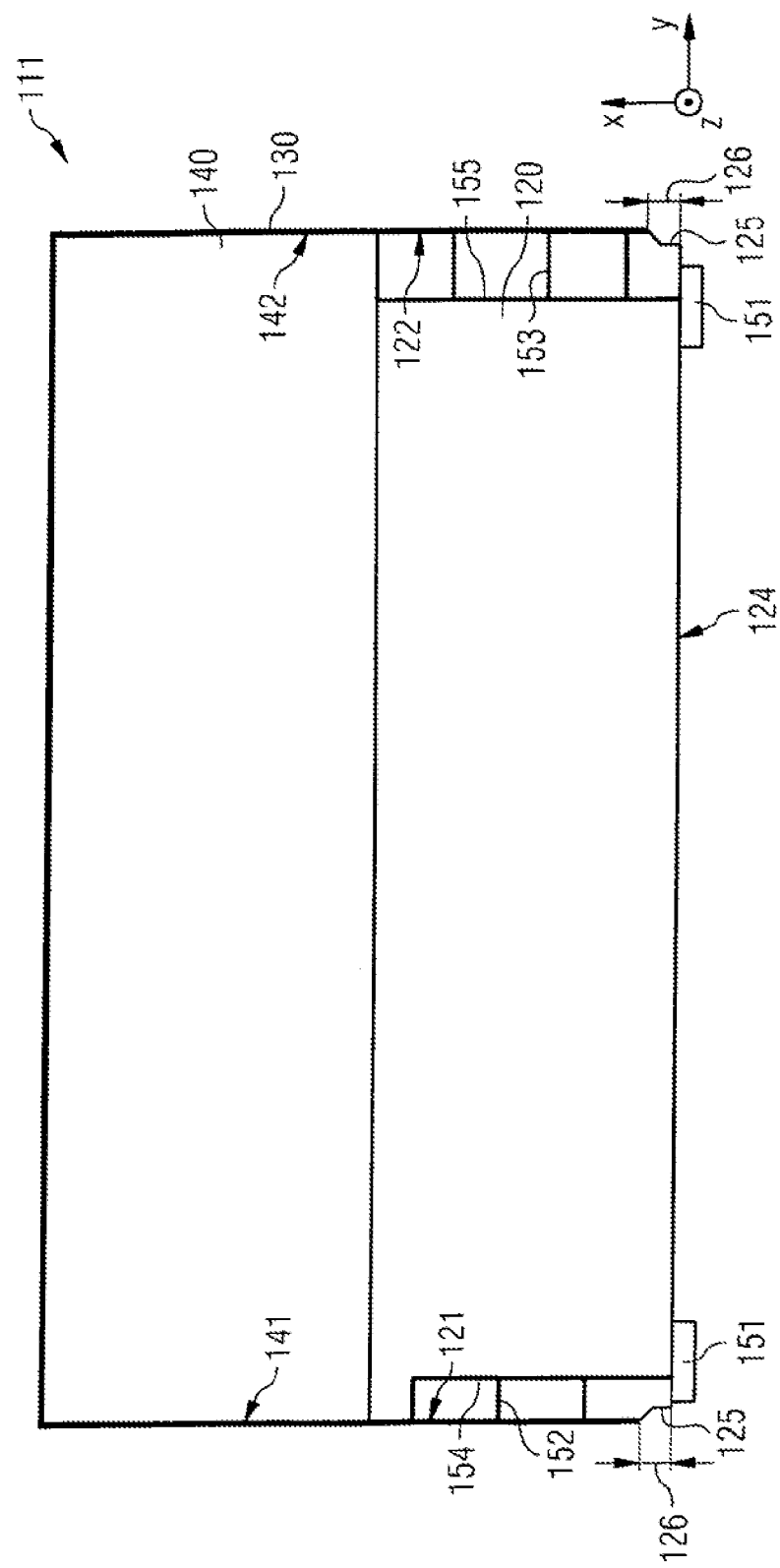

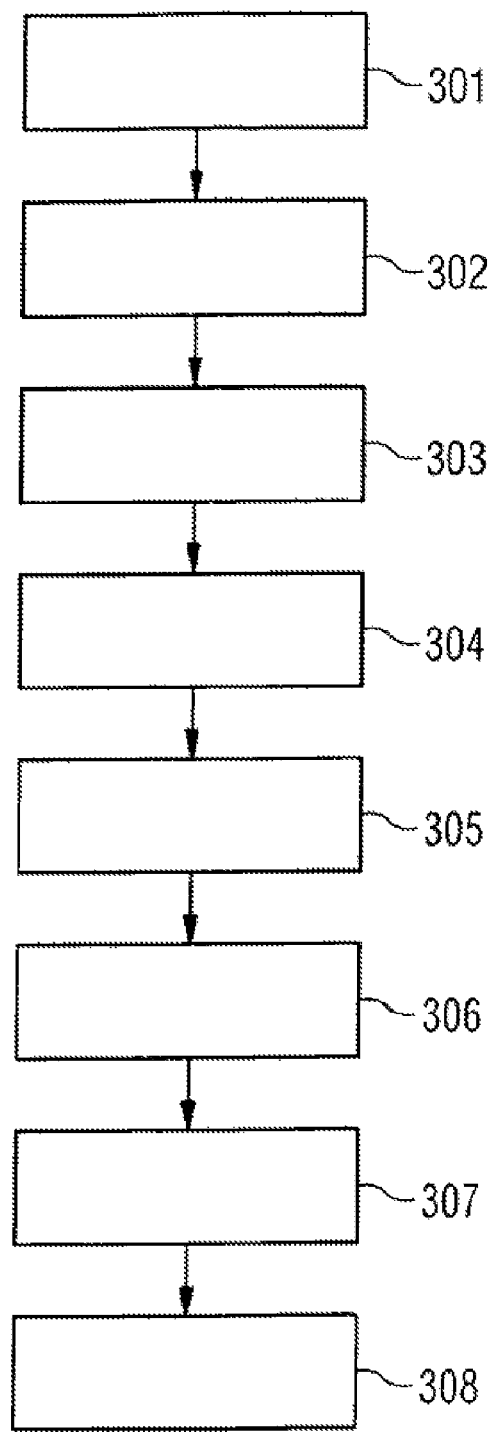

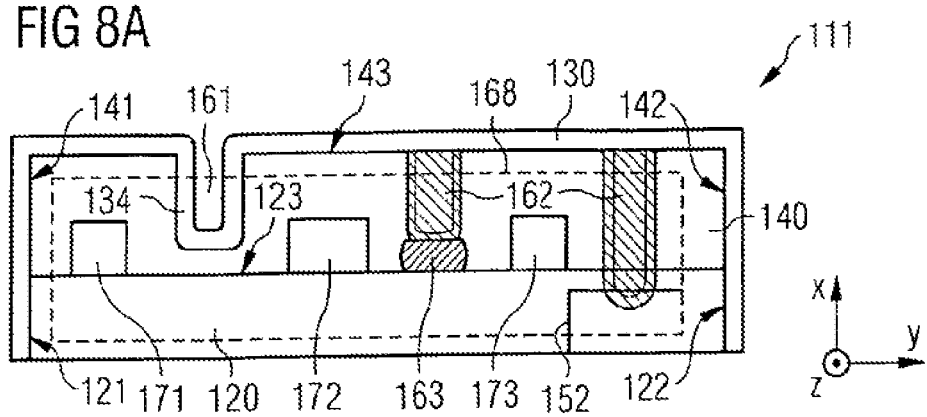
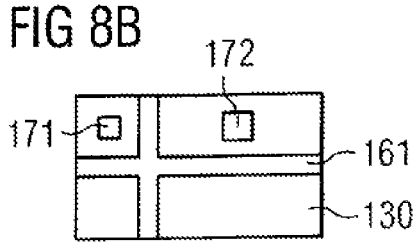
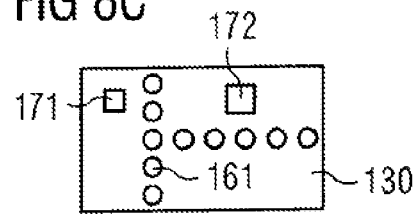
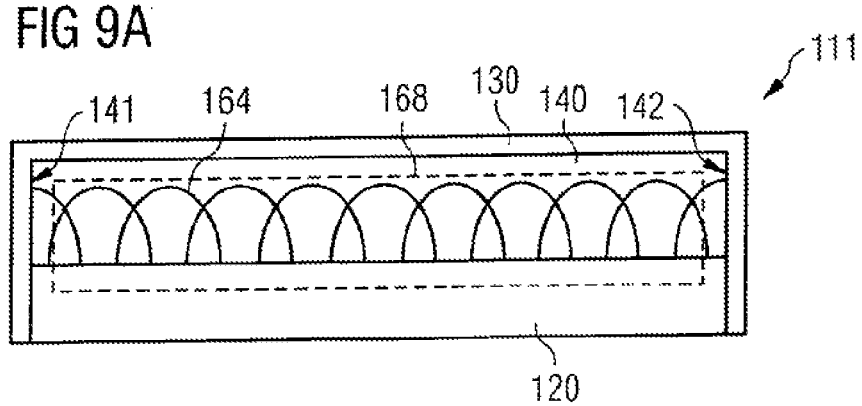
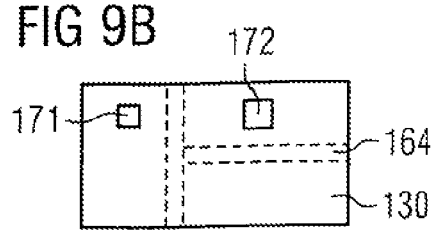

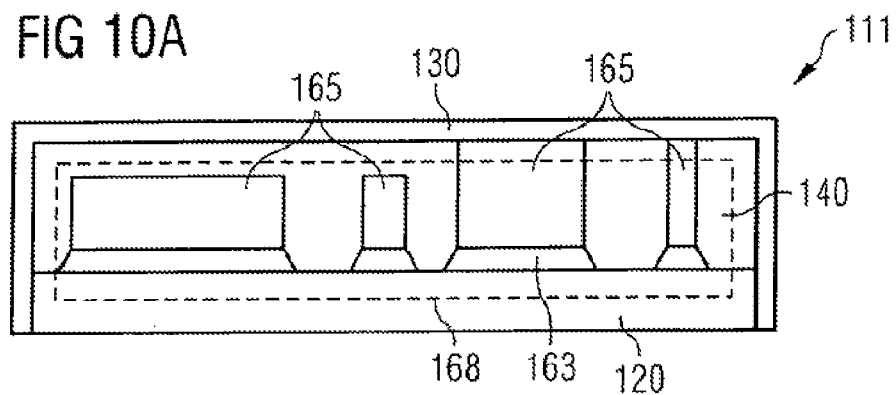
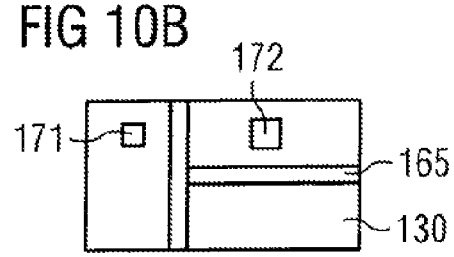
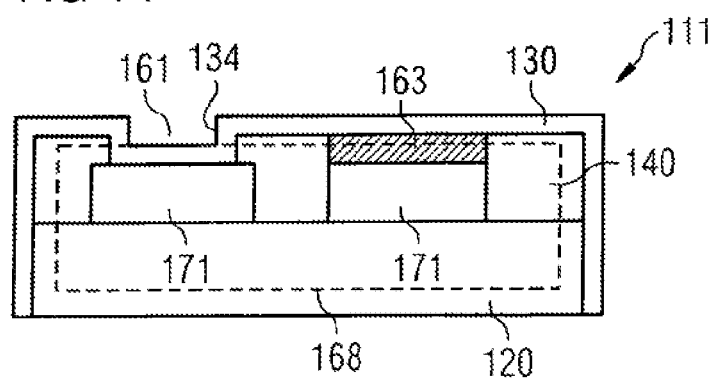
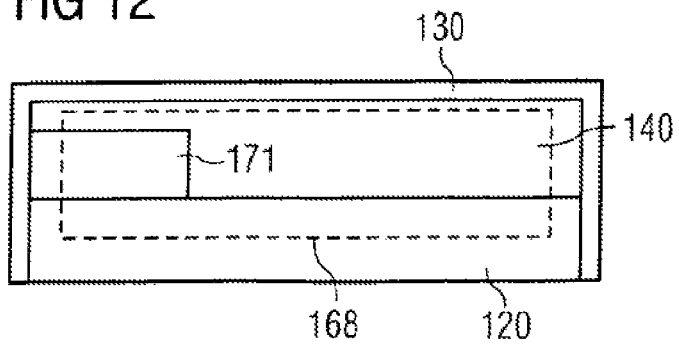

METHOD FOR PRODUCING A PLURALITY OF ELECTRONIC DEVICES

FIELD OF THE INVENTION

The invention relates to a method for producing a plurality of electronic devices, and to an electronic device produced by such a method. The electronic devices in each case have an electromagnetic protective layer for electromagnetic shielding, via which, in particular, heat can simultaneously be dissipated.

BACKGROUND OF THE INVENTION

In radio-frequency circuits, a multiplicity of different frequencies arise during operation. These radio-frequency signals and their superimpositions are emitted by the circuit if the metal structures of the circuit form an antenna for the interference radiation. By way of example, in cellular telephones a defined radiation power emerging from the cellular telephone is obligatory.

Moreover, circuits have to be protected against influences from incoming signals and radiation. For shielding radio-frequency signals, by way of example, the complete system comprising the circuit can be shielded by a fully shielded metallic housing. In order to save costs and to be able to reduce the size of the circuits and systems, instead of shielding the entire system, it is also possible to shield the circuits or electronic devices individually.

Conventionally, for this purpose, by way of example, a housing composed of metal is applied on the top side of the carrier of the device. In this case, tolerances in the arrangement of the metal housing on the carrier, the thickness of the metal and the required contact area have to be taken into account, which increases the size of the device.

In this case, it is necessary not only to protect the circuit as a whole against an emission and/or against influences from incoming signals and radiation, but also to electromagnetically shield individual regions of the circuit among one another.

The heat occurring during operation from electronic components of the circuit should also be dissipated from the components during operation.

For the purpose of electromagnetic shielding, by way of example, conventionally a panel comprising a substrate, an encapsulation arranged thereon and electronic components enclosed thereby is scribed to an extent such that conductive layers of the substrate are uncovered, but the substrate is not completely severed. A metal layer is thereupon applied to the partly cut panel, said metal layer serving for radio-frequency shielding. Only afterward is the panel completely severed and thus singulated to form the individual electronic devices. In this case, for the panel the cutting tolerances have to be taken into account and, moreover, a projection is left behind at the edge of the devices. This also leads to an increased space requirement. One such method is disclosed for example in U.S. Pat. No. 7,451,539 B2.

It is desirable to specify an electronic device and a method for producing a plurality of electronic devices which makes possible compact electronic devices. Moreover, the intention is for a shielding of regions of the respective devices and a heat dissipation to be reliably possible.

In one embodiment of the invention, a method for producing a plurality of electronic devices comprises providing a panel comprising an areally extended substrate, an encapsulation and electronic components, such as, for example, filters, transistors, resistors, capacitors and/or inductances. The panel is singulated to form a plurality of electronic devices. After singulation, a respective electromagnetic protective layer is applied to each of the electronic devices, such that the electromagnetic protective layer covers the side faces of the substrate that are exposed by the singulation.

As a result of applying the electromagnetic protective layer after singulating the panel to form the plurality of electronic devices, it is possible to reduce the size of the electronic devices. No contact area for an external shielding housing need be provided on the substrate. Moreover, no projection remains at the edge of the substrate, as in the case of a two-stage singulation process, if the panel is singulated with one cut.

By way of example, the electromagnetic protective layer is applied by means of a sputtering deposition method.

In one exemplary embodiment, at least one partial layer of the electromagnetic protective layer is applied to the electronic device by means of sputtering deposition. In a further embodiment, the electromagnetic protective layer is applied in electroless fashion. At least one partial layer of the electromagnetic protective layer is applied in electroless fashion, for example. In one embodiment, a partial layer comprising titanium and/or a partial layer comprising copper are/is applied by means of sputtering deposition and a partial layer comprising nickel is thereupon applied to the first partial layers in electroless fashion.

In one embodiment, the electromagnetic protective layer is applied such that the side faces of the electronic devices which are oriented transversely with respect to the main propagation direction of the electronic devices or of the substrate are in each case completely covered by the electromagnetic protective layer. This is possible since the panel and thus also the substrate are firstly singulated and only afterward is the electromagnetic protective layer applied. Therefore, during the application of the protective layer, the electronic devices of the plurality of electronic devices are not connected, even over a partial region of the substrate, such that in particular the side faces of the substrate are exposed during the application of the electromagnetic protective layer.

In one embodiment, an notch, in particular an undercut, is formed, for example cut beginning at the underside, into the substrate in a region adjoining the underside of the substrate. As a result, in the embodiment the electromagnetic protective layer is applied such that the side faces of the electromagnetic devices which are oriented transversely with respect to the main propagation direction of the electronic devices or of the substrate are in each case completely covered by the electromagnetic protective layer, apart from in the region of the notch or of the undercut, in which no partial layer is deposited during the sputtering deposition. Therefore, the nickel layer, too, is not applied in the notch.

In accordance with further aspects of the invention, the method for producing a plurality of electronic devices comprises providing an areally extended panel, in turn comprising: a substrate and a plurality of electronic components arranged on the substrate. Furthermore, the panel comprises an encapsulation covering the plurality of components on the substrate.

The panel is singulated to form the plurality of electronic devices. After singulation, a respective electromagnetic protective layer is applied to the devices of the plurality of electronic devices, such that the electromagnetic protective layer covers the side faces of the substrate that are exposed by the singulation, and such that the electromagnetic protective layer is in each case thermally and/or electrically coupled to a region of the electronic device that is enclosed by the encapsulation.

As a result of applying the electromagnetic protective layer after singulating the panel to form the plurality of electronic devices, it is possible to reduce the size of the electronic devices and at the same time to realize a reliable electromagnetic shielding and heat dissipation. No contact area for an external shielding housing need be provided on the substrate. Moreover, no projection remains at the edge of the substrate, as in the case of a two-stage singulation process, if the panel is singulated with one step.

In embodiments, the electromagnetic protective layer is applied by means of a sputtering deposition method. In embodiments, the electromagnetic protective layer is applied such that the side faces of the electronic devices which are established transversely with respect to the main propagation direction of the electronic devices or of the substrate are in each case completely covered by the electromagnetic protective layer. This is possible since the panel and thus also the substrate are firstly singulated and only afterward is the electromagnetic protective layer applied. Therefore, during the application of the protective layer, the electronic devices of the plurality of electronic devices are not connected, even over a partial region of the substrate, such that in particular the side faces of the substrate are exposed during the application of the electromagnetic protective layer.

In embodiments, for the purpose of thermal and/or electrical coupling, cutouts are introduced into the encapsulation, electrically and/or thermally conductive material being arranged in said cutouts. In further embodiments, coupling elements are arranged prior to applying the electromagnetic protective layer, which coupling elements are subsequently thermally and/or electrically coupled to the electromagnetic protective layer after the latter has been applied.

In one embodiment of the invention, an electronic device comprises an areally extended substrate, and an encapsulation arranged on a main face of the substrate. An electromagnetic protective layer completely covers a surface of the encapsulation that faces away from the substrate, and the side faces of the substrate that are directed transversely with respect to the surface.

Such an electronic device is compact and well shielded against radio-frequency radiation.

In particular, the electromagnetic protective layer covers the side faces of the encapsulation and of the substrate completely beginning at the surface of the encapsulation as far as an opposite underside of the substrate.

In accordance with further aspects of the invention, an electronic device comprises a substrate and at least one electronic component arranged on the substrate. An encapsulation covers the component on the substrate. The electronic device furthermore comprises an electromagnetic protective layer, which covers a surface of the encapsulation that faces away from the substrate, and the side faces of the substrate that are directed transversely with respect to the surface. The device furthermore comprises a thermal and/or electrical coupling, which couples the electromagnetic protective layer thermally and/or electrically to a region of the electronic device that is enclosed by the encapsulation.

In particular, the electromagnetic protective layer completely covers the side faces of the encapsulation and of the substrate.

An electromagnetic shielding of individual regions of the electronic device is made possible by the thermal and/or electrical coupling. In particular, the electronic component, comprising, for example, filters, transistors, resistors, capacitors and/or inductances, is electrically shielded by the electrical coupling that couples the electromagnetic protective layer to the region that is enclosed by the encapsulation. In this case, the electrical coupling is short-circuited to ground via the electromagnetic protective layer.

As a result of the thermal and/or electrical coupling that thermally couples the electromagnetic protective layer to the region that is enclosed by the encapsulation, the coupling is designed to dissipate heat that occurs from the electronic component during operation, for example, via the electromagnetic protective layer. Reliable operation of the electronic device is possible as a result.

In embodiments, the thermal and/or electrical coupling is embodied as part of the electromagnetic protective layer which extends into the region that is enclosed by the encapsulation. In further embodiments, the coupling comprises a separate coupling element, which is thermally and/or electrically coupled to the electromagnetic protective layer and to the region that is enclosed by the encapsulation.

In embodiments, the thermal coupling is embodied as part of the electromagnetic protective layer, and in the embodiments, the electromagnetic protective layer is in direct contact with the electronic component. In further embodiments, the electronic component is thermally coupled to the electromagnetic protective layer via the coupling element, wherein the coupling element is in direct contact with the electrical component.

In accordance with further aspects of the invention, an electronic device comprises a substrate and at least one electronic component arranged on the substrate. An encapsulation covers the component on the substrate. The electronic device furthermore comprises an electromagnetic protective layer, which completely covers a surface of the encapsulation that faces away from the substrate, and the side faces that are directed transversely with respect to the surface, from the surface of the encapsulation as far as an opposite underside of the substrate. The device furthermore comprises a thermal and/or electrical coupling, which couples the electromagnetic protective layer thermally and/or electrically to a region of the electronic device that is enclosed by the encapsulation.

BRIEF DESCRIPTION OF THE DRAWINGS

Further advantages, features and developments will become apparent from the following examples explained in conjunction with FIGS. 1 to 14.

FIG. 4 shows a schematic illustration of an enlarged excerpt from the electronic device from FIG. 1, FIG. 5 shows a schematic illustration of an electronic device in accordance with one embodiment, FIG. 6 shows a flowchart of a method for producing a plurality of electronic devices in accordance with one embodiment, FIG. 7 shows a flowchart of a method for producing a plurality of electronic devices in accordance with one embodiment, FIGS. 8A to 8C show a schematic illustration of an electronic device in accordance with embodiments, FIGS. 9A and 9B show a schematic illustration of an electronic device in accordance with one embodiment, FIGS. 10A and 10B show a schematic illustration of an electronic device in accordance with one embodiment, FIG. 11 shows a schematic illustration of an electronic device in accordance with one embodiment, FIG. 12 shows a schematic illustration of an electronic device in accordance with one embodiment.

Elements that are identical, of identical type and act identically may be provided with the same reference signs in the figures. The elements illustrated and their size relationships with respect to one another should not be regarded as true to scale, in principle; rather, individual elements, such as, for example, layers and regions, may be illustrated with exaggerated thickness or size dimensions in order to enable better illustration and/or in order to afford a better understanding.

DETAILED DESCRIPTION OF EMBODIMENTS

Figure 1:
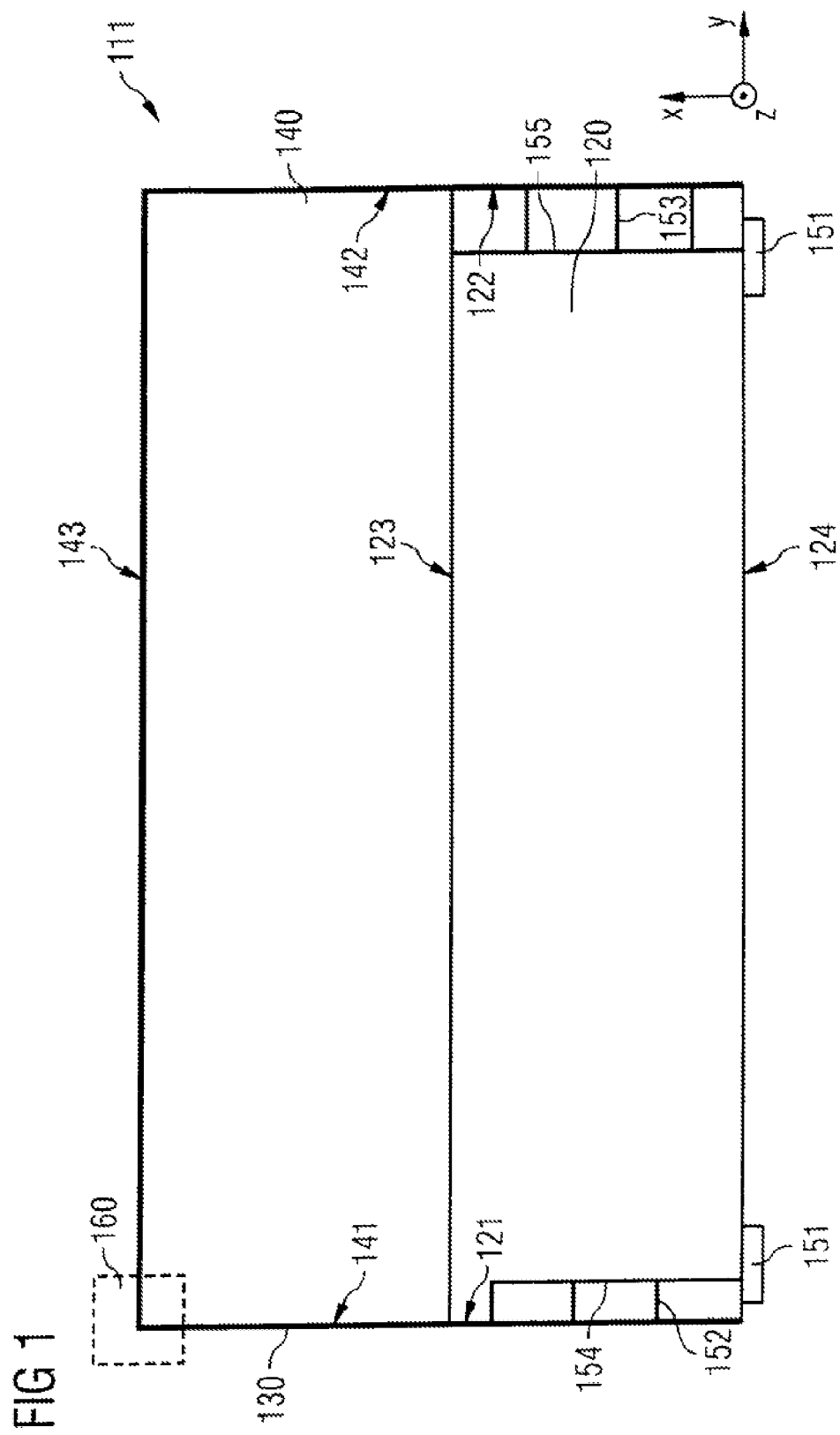
FIG. 1 shows a schematic illustration of an electronic device in accordance with one embodiment.

FIG. 1 shows a schematic illustration of an electronic device 111. The device 111 comprise a substrate 120 and an encapsulation 140. An electromagnetic protective layer 130 surrounds the substrate 120 and the encapsulation 140.

The substrate 120 is designed for mechanical fixing and electrical connection. The substrate 120 is a ceramic substrate, for example. In a further embodiment, the substrate 120 is a laminate. The substrate 120, which is areally extended in the Y-Z direction, has a main face 123 and an opposite underside 124 which are oriented in the Y-Z direction. Transversely with respect to the sides 123 and 124, the substrate has a side face 121 and an opposite side face 122.

The electronic device is extended in three dimensions and has two further side faces (not illustrated) running transversely with respect to the side faces shown. The description of the side faces shown also relates to the side faces not illustrated.

The substrate has contact-connections 152 and 153 oriented in the main propagation direction. Furthermore, the substrate has contact-connections (vias) 154 and 155 directed transversely with respect to the main propagation. The contact-connections 152, 153, 154 and 155 are electrically conductive. The electronic device 111 can also have fewer than the contact-connections illustrated, or the electronic device 111 comprises more contact-connections in further embodiments.

The contact-connection 154 is electrically coupled to a contact area 151 at the underside 124 of the substrate 120. Likewise, the contact-connection 155 is electrically coupled to a further contact area. Via the contact areas 151, the electronic device 111 can be electrically contact-connected externally.

The encapsulation 140 is arranged in the X-direction on the main face 123 of the substrate 120. The encapsulation 140 has a surface 143 that faces away from the substrate 120. The encapsulation 140 has side faces 141 and 142 directed transversely with respect to the surface 143. The side face 141 adjoins the side face 121 of the substrate 120. The side face 142 of the encapsulation adjoins the side face 122 of the substrate 120.

The electromagnetic protective layer 130 completely covers the surface 143, the side face 141 and the side face 142 of the encapsulation 140. The electromagnetic protective layer 130 furthermore completely covers the side face 121 and the side face 122 of the substrate 120. The electromagnetic protective layer 130 completely covers the side faces 121, 141 and 122, 142 of the electronic device 111 beginning in the X-direction at the underside 124 of the substrate 120 as far as the surface 143 of the encapsulation 140. The electromagnetic protective layer is electrically coupled to the contact-connection 152 and the contact-connection 133 in order to be grounded during operation, for example. The electromagnetic protective layer is electrically coupled to the contact-connections 154 and 155 via the contact-connections 152 and 153, such that the electromagnetic protective layer 130 is electrically coupled to the contact areas 151 via the contact-connections 152, 153, 154 and 155.

The electromagnetic protective layer 130 protects the electronic device 111 against influences from radio-frequency signals that arrive or are generated during operation. In one embodiment, the electromagnetic protective layer 130 has a thickness of less than 8 micrometers, for example a thickness of less than 6 micrometers, in particular a thickness of 4 micrometers plus/minus 5%. Consequently, the space requirement on the electronic device for the electromagnetic protective layer is small and compact devices can thus be realized.

The electromagnetic protective layer 130 comprises, as is explained in greater detail below in conjunction with FIG. 4, for example partial layers composed of titanium, copper and nickel.

Figure 2:
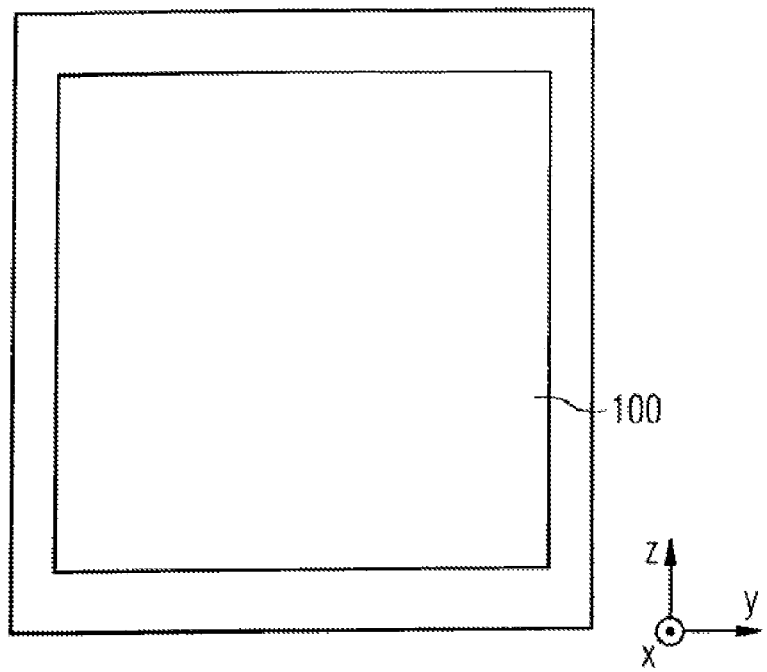
FIG. 2 shows a schematic illustration of a panel in accordance with one embodiment.

The electronic device 111 without the protective layer 130 is singulated from a panel 100, as shown in plan view in FIG. 2.

FIG. 2 shows a schematic illustration of a panel 100, from which a plurality of the electronic devices 111 are singulated. The panel 100 comprises the substrate 120 and the components 171, 172 and 173 arranged thereon, and the encapsulation 140 arranged thereon. Prior to singulation, the panel 100 has a larger extent than the electronic device 111. In embodiments, the panel 100 comprises all elements of the devices 111 with the exception of the electromagnetic protective layer 130.

Figure 3:
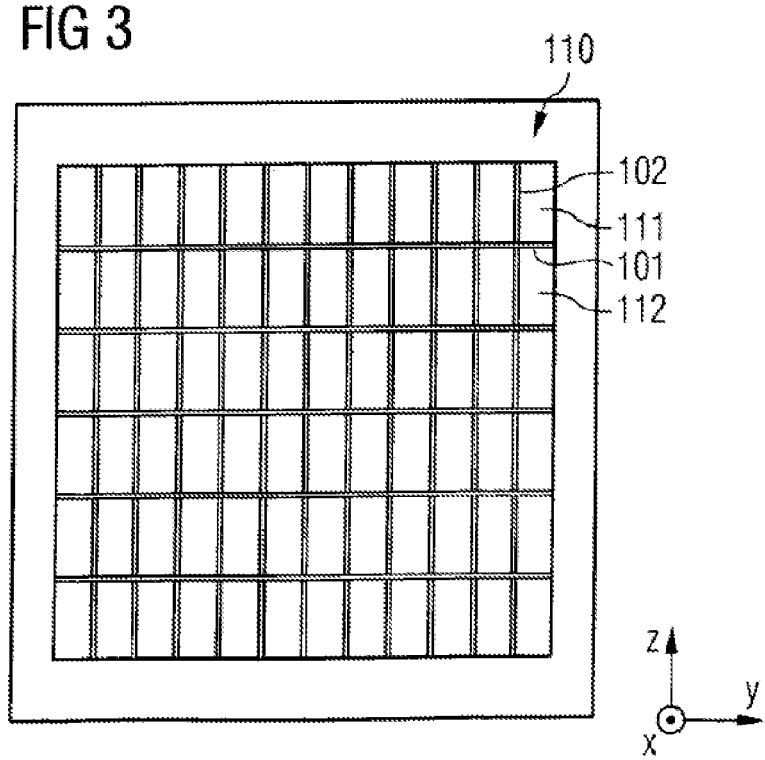
FIG. 3 shows a schematic illustration of the panel after singulation in accordance with one embodiment.

FIG. 3 shows a schematic illustration of how the panel 100 from FIG. 2 was singulated to form a plurality 110 of electronic devices 111, 112.

For this purpose, by way of example, the panel 100 is severed by a saw blade along the line 101 and 102. In a further embodiment, the panel 100 is scribed along the lines 101 and 102 and then broken. The panel and in particular the substrate are completely severed in the X-direction at the lines 101 (Y-direction) and 102 (Z-direction), such that the electronic devices, as shown for example in FIG. 1 or in FIGS. 5 and 8 to 14, are formed, which are coated with the electromagnetic protective layer 130 after singulation. In particular, after the panel has been singulated to form the plurality of devices, the protective layer 130 is in each case applied to the devices such that the side faces 121, 141 and 122, 142 are completely covered by the protective layer 130. Moreover, the protective layer 130 is applied after singulation such that it is thermally and/or electrically coupled to a region 168 (FIGS. 8 to 14) of the electronic device 111.

FIG. 4 shows a schematic illustration of the excerpt 160 from FIG. 1.

The protective layer 130 is arranged on the surface 143 and the side face 141 of the encapsulation 140. Beginning at the encapsulation 140, a first partial layer 131 of the electromagnetic protective layer 130 is formed. The first partial layer 131 comprises titanium, in particular. By way of example, the first partial layer 131 is applied by means of sputtering deposition. A second partial layer 132 is applied on that side of the first partial layer 131 which is opposite to the encapsulation 140. The second partial layer 132 comprises copper, in particular, In one embodiment, the second partial layer 132 is likewise applied by means of sputtering deposition. A third partial layer 133 is applied on that side of the second partial layer 132 which faces away from the first partial layer 131. The third partial layer 133 comprises nickel, in particular.

In embodiments, the partial layer 131 has a thickness of 0.05 micrometer to 0.2 micrometer. In embodiments, the partial layer 132 has a thickness of 0.15 micrometer to 0.6 micrometer. In embodiments, the partial layer 133 has a thickness of 1.75 micrometers to 7 micrometers. In one embodiment, the partial layer 131 is applied with a thickness of 0.1 micrometer. In the embodiment, the partial layer 132 is applied with a thickness of 0.3 micrometer. In the embodiment, the partial layer 133 is applied with a thickness of 3.5 micrometers. The electromagnetic protective layer 130 overall is thicker than 2.5 micrometers in order to realize a good electromagnetic shielding.

The third partial layer 133 is applied in electroless fashion, for example. In particular, the first partial layer 131 and/or the second partial layer 132 serve(s) as a start layer for applying the nickel layer in electroless fashion. Thus, a homogeneous thickness of the electromagnetic protective layer 130 can be achieved and a good adhesion of the electromagnetic protective layer 130 on the encapsulation 140 is achieved, in particular, at the corners, for example where the side face 141 and the surface 143 meet one another.

FIG. 5 shows an electronic device 111 as explained with reference to FIG. 1, in accordance with a further embodiment. The electronic device in the embodiment in FIG. 5 substantially corresponds to the embodiments in FIG. 1. In contrast to the embodiment in FIG. 1, the electronic device 111 in FIG. 5 has notchs 125, in particular undercuts.

The notchs 125 are arranged at the side faces 121 and 122 of the substrate 120 at the underside 124. The notchs penetrate into the substrate 120 from outside the device. In the X-direction, a cut is made into the substrate in a region 126 of the side faces 121 and 122 that adjoins the underside 124. The electronic device in accordance with the embodiment in FIG. 5 has no electromagnetic protective layer 130 in the region 126. In the embodiment, the electromagnetic protective layer 130 covers the side faces 141 and 142 of the encapsulation 140. In the negative X-direction, the electromagnetic protective layer 130 covers the side walls 121 and 122 of the substrate 120 beginning at the main face 123 as far as the region 126 or as far as the notch 125.

The notch 125 is introduced into the substrate 120 during the singulation of the electronic devices from the panel 100. By way of example, the saw blade penetrates into the substrate 120 beginning at the underside 124. In the region 126, the cut into the substrate is widened, such that the notch 125 is formed. A thinner cut is made in the remaining region of the substrate than in the notch 125.

FIG. 6 shows a flowchart of a method for producing the plurality 110 of electronic devices 111, 112 in accordance with one embodiment.

In step 201, the areally extended panel 100 is provided.

In step 202, the panel 100 is singulated to form the plurality 110 of electronic devices 111, 112, for example is severed or scribed by a saw blade and then broken.

After the singulation in step 202, in step 203 the electromagnetic protective layer 130 is applied to each device 111, 112 of the plurality 110 of electronic devices 111, 112.

As a result of applying the electromagnetic protective layer 130 in step 203 after the singulation in step 202, only a single singulation step is necessary. Therefore, no additional area for a second or third singulation step need be taken into account on the substrate either. Therefore, electronic devices having small dimensions can be produced by the method according to the application. There is also no need to provide additional contact areas at the top side of the devices on which metallic protective housings might be fixed. This also has the effect that the devices according to the application can be produced in a small fashion.

Moreover, method step 203 can be incorporated relatively simply into an already existing production process, since it follows the complete singulation of the devices. Therefore, it is also possible to maintain existing design specifications for the electronic devices 111, 112, in particular without requiring additional area on the substrate.

FIG. 7 shows a method for producing the plurality 110 of electronic devices 111, 112 in accordance with a further embodiment.

In step 301, the areally extended substrate 120 provided is covered with the encapsulation 140.

The panel 100 is thereupon laser-inscribed in step 302. As a result of laser inscription in step 302 after encapsulation in step 301 prior to applying the electromagnetic protective layer 130, it is possible to avoid damage to the electromagnetic protective layer resulting from the laser.

In step 303, corresponding to step 202 from FIG. 6, the areally extended substrate 120 and the meta-device 100 are singulated to form the plurality 110 of electronic devices 111, 112.

Afterward, in step 304, the surface 143 and the side faces 121, 141, 122, 142 (FIG. 1) of the electronic devices are cleaned and/or activated by a plasma process in order to enable the best possible adhesion of the subsequently applied electromagnetic protective layer. In further embodiments, the surface 143 and the side faces 121, 141, 122, 142 (FIG. 1) of the electronic devices are cleaned and/or activated by other methods, for example chemically. In step 304, the partial layers 131 and 132 are additionally applied by means of sputtering deposition.

In step 305, a palladium activation of the partial layer 132 and/or of the partial layer 131 is effected.

The partial layer 133 is thereupon applied in step 306, such that the electromagnetic protective layer 130 is applied after complete singulation in step 303 in the subsequent steps 304, 305 and 306.

Step 307 involves cleaning and drying the plurality 110 of electronic devices.

Step 308 thereupon involves testing the electronic devices 111, 112 for functionality.

In order to produce an electronic device in accordance with the embodiment in FIG. 5, when singulating the electronic devices in step 302 prior to applying the electromagnetic protective layer, the notch 125 is introduced into the substrate. During the subsequent application of the partial layers 131 and 132 by means of sputtering deposition in step 304, the partial layers 131 and 132 are applied on the side faces only as far as the region 126, such that the region 126 or the notch 125 remains free of the partial layers 131 and 132. In particular, the notchs 125 have no titanium and/or copper deposits after the sputtering deposition. Accordingly, during the subsequent electroless deposition of the nickel layer 133 in step 306, this layer does not deposit in the region 126 or the notch 125 either, since the start layer for deposition is absent.

Production in this way makes it possible to prevent the electromagnetic protective layer 130 from additionally depositing on a support on which the electronic devices are arranged during the application of the electromagnetic protective layer 130. Said support is removed again after the electromagnetic protective layer has been applied and before the electronic devices are tested. By virtue of the fact that no electromagnetic protective layer is formed in the region 126 or in the notch 125 adjoining the underside 124 of the substrate, the detachment of the electromagnetic device from the support is simplified. In particular, this prevents as far as possible the support from clinging to the electromagnetic device in part via the protective layer 130.

A production method for compact electronic devices which are well shielded from radio-frequency radiation is thus realized.

FIG. 8A shows a schematic illustration of the electronic device 111 in accordance with a further embodiment. The device 111 comprises the substrate 120 and the encapsulation 140, which is arranged on the main face 123 of the substrate 120. The electromagnetic protective layer 130 surrounds the substrate 120 and the encapsulation 140.

The substrate 120 is designed for mechanical fixing and electrical connection. The substrate 120 is a ceramic substrate, for example. In a further embodiment, the substrate 120 is a laminate. The substrate 120, which is areally extended in the Y-Z direction, has the main face 123, which is oriented in the Y-Z direction in FIG. 8A. Transversely with respect to the main face 123, the substrate has the opposite side faces 121 and 122.

The electronic device is extended in three dimensions and has two further side faces (not illustrated) running transversely with respect to the side faces shown. The description of the side faces shown also relates to the side faces not illustrated.

Electronic components 171, 172, 173 are arranged on the main face 123. The electronic components, for example filters, transistors, resistors, capacitors and/or inductances, are carried by the substrate 120 and are electrically drivable via the substrate or via electrical lines and contact-connections of the substrate.

The electronic components 171, 172, 173 are enclosed by the encapsulation 140 arranged on the main face 123 of the substrate 120. The encapsulation 140 has the surface 143 facing away from the substrate. The encapsulation 140 has the side faces 141 and 142 directed transversely with respect to the surface 143. The side face 141 adjoins the side face 121 of the substrate 120. The side face 142 of the encapsulation adjoins the side face 122 of the substrate 120.

The electromagnetic protective layer 130 completely covers the surface 143, the side faces 141 and the side face 142 of the encapsulation 140. The electromagnetic protective layer 130 furthermore completely covers the side face 121 and the side face 122 of the substrate 120. In further embodiments, the substrate 120 has notchs, in particular undercuts, which penetrate into the substrate 120 from outside the device, at the side faces 121 and 122 at the side facing away from the encapsulation 140. Said undercuts can be free of the electromagnetic protective layer, thereby simplifying the singulation of the panel to form the plurality of electronic devices.

The electromagnetic protective layer 130 protects the electronic device 111 and in particular the electronic components 171, 172 and 173 against influences from radio-frequency signals that arrive or are generated during operation. In embodiments, the electromagnetic protective layer 130 comprises partial layers, for example the partial layers 131, 132 and 133 composed of titanium, copper and nickel, respectively.

In order that the electronic components 171, 172 and 173 are shielded from electromagnetic radio-frequency radiation among one another as well, the electromagnetic protective layer 130 is coupled to the region 168 that is enclosed by the encapsulation. In particular, the electronic components 171, 172 and 173 are arranged in the region 168. In embodiments, the region 168 extends at least into a part of the substrate 120. In particular, the region 168 is spaced apart from the surface 143 of the encapsulation. Furthermore, in embodiments, the region 168 is spaced apart from the side faces 121 and 141, and 122 and 142.

The component 171 is electrically or electromagnetically shielded from the component 172 since a cutout is introduced into the encapsulation 140 between the components 171 and 172. The cutout begins at the surface 143 and extends in the direction of the substrate 120. The cutout reaches into the region 168. In embodiments, the cutout does not reach as far as the substrate 120. During the application of the electromagnetic protective layer 130, material of the protective layer 130 deposits at the sidewalls of the encapsulation that enclose the cutout 161. As a result, the electromagnetic protective layer 130 extends in a part 134 into the region 168 enclosed by the encapsulation. By virtue of the fact that the part 134 is electrically coupled to the electromagnetic protective layer 130 and the latter is in turn electrically coupled to ground, the electronic components 171 and 172 are shielded from one another by the cutout 161 lined with the part 134 of the electromagnetic protective layer 130. The cutout 161 is sawn or drilled into the encapsulation 140, for example. In further embodiments, the cutout is introduced into the encapsulation by means of an etching method.

The electronic components 172 and 173 are shielded from one another in a manner comparable to the electronic components 171 and 172. In contrast to the shielding of the components 171 and 172, the cutout arranged between the components 172 and 173 is preferably completely filled with an electrically conductive material. The electrically conductive material 162 is introduced into the cutout before the electromagnetic protective layer 130 is applied. Consequently, the electromagnetic protective layer 130 covers the material 162 at the surface 143 and is electrically coupled to said material.

Furthermore, in contrast to the shielding between the components 171 and 172, a conductive material 163 is applied between the components 172 and 173 on the surface 123 of the substrate 120 such that said material is electrically coupled to the material 162 after the latter has been introduced into the cutout. The cutout between the components 172 and 173 reaches from the surface 143 of the encapsulation as far as the conductive material 163.

In further embodiments, the material 163 between the electronic components 172 and 173 is absent, in a manner comparable to the shielding between the components 171 and 172. In further embodiments, the conductive material 163 is arranged between the components 171 and 172, such that the part 134 of the electromagnetic protective layer 130 is coupled to the conductive material 163.

In further embodiments, the cutout 161 reaches from the surface 143 completely through the encapsulation 140 right into the substrate 120. In the substrate, the conductive material 162 arranged in the cutout 161 is electrically coupled, in particular, to the contact-connection 152.

FIG. 8B shows a plan view of the electronic device from FIG. 8A in accordance with one embodiment. In accordance with the embodiment in FIG. 8B, the cutouts 161 are introduced by sawing into the encapsulation or into the encapsulation and a part of the substrate. In accordance with the exemplary embodiment in FIG. 8B, therefore, four regions are formed which are shielded from electromagnetic radiation relative to one another. The component 171 is arranged in one of said regions and the component 172 is arranged for example in another of said regions. The cutout 161 runs between the component 171 and the component 172, such that after the cutout 171 has been electrically conductively lined or filled and has been coupled to the protective layer 130 for grounding purposes, said components are shielded from one another.

FIG. 8C shows a plan view of the device from FIG. 8A in accordance with a further embodiment, in which the cutouts 161 are introduced by drilling into the encapsulation or the encapsulation and a part of the substrate. Here, too, individual regions of the device are formed which are shielded from one another. In comparison with introducing the cutouts by means of sawing, more flexible regions can be formed when introducing said cutouts by drilling.

FIG. 9A shows the electronic device 111 with a further embodiment of the electrical coupling between the region 168 and the electromagnetic protective layer 130. In contrast to the embodiments in FIGS. 8A to 8C, the coupling is not realized via cutouts, but rather by means of bonding wires 164 applied on the substrate such that they form a grid that is non-transmissive to high-frequency radiation. The bonding wires are coupled to the electromagnetic protective layer 130 at the side faces 142 and 143, respectively.

FIG. 9B shows the component from FIG. 9A in plan view. Regions of the device in which the components 171 and 172 are arranged are electromagnetically shielded from one another by the bonding wire 164.

FIG. 10A shows further exemplary embodiments of the electronic device 111. In contrast to the exemplary embodiments in the preceding FIGS. 8 and 9, the shielding of the components 171 and 172 is realized by metal laminae 165, which are coupled to the substrate 120 by means of the electrically conductive material 163 and are arranged in the region 168. In embodiments, the metal laminae reach from the substrate 120 as far as the electromagnetic protective layer 130 and are directly electrically coupled thereto. In further embodiments, the laminae 165 reach from the substrate right into the encapsulation 140 and are not directly coupled to the electromagnetic protective layer 130, but rather via contact-connections arranged in the substrate 120.

FIG. 10B shows a plan view of the electronic device 111 from FIG. 10A. Regions of the device are shielded from radio-frequency radiation relative to one another by the laminae 165. The components 171 and 172 are arranged in the regions, and so said components are shielded relative to one another.

The shielding of the electronic components has been described merely by way of example on the basis of the components 171, 172 and 173. Any further combination of components, in particular it is also possible to arrange just two components on the substrate, or more than three components, for example four or more components, is also possible, of course. Moreover, it is possible to combine the different embodiments of the shielding in accordance with FIGS. 8A, 8B, 8C, 9A, 9B, 10A and 10B in a device 111.

FIG. 11 shows a further exemplary embodiment of the device 111, in which the components 171 are thermally coupled to the electromagnetic protective layer 130, such that heat occurring during operation from the components 171 is dissipated via the electromagnetic protective layer 130. In accordance with one embodiment, for this purpose, the cutout 161 is introduced into the encapsulation 140 such that the component 171 is at least partly exposed before the protective layer 130 is applied. During the application of the protective layer 130, therefore, the part 134 of the protective layer is arranged in the cutout and in particular on the component 171, such that the component 171 arranged in the region 168 is thermally coupled to the rest of the protective layer 130 via the part 134 of the protective layer 130.

In further embodiments, the cutout 161, as already explained with reference to FIG. 8A, is filled with material 163, which is, in particular, thermally conductive. The material 163 is in direct contact with the component 171 and with the electromagnetic protective layer 130. Heat occurring during operation from the component 171 is omitted via the thermally conductive material 163 to the protective layer 130 and can be passed on from there.

FIG. 12 shows a further exemplary embodiment of the device 111, in which the component 171 is arranged at the edge of the substrate 120 such that it is in direct contact with the electromagnetic protective layer 130 at the side 121 or 141. Heat that arises during operation in the region 168 is emitted via the component 171 to the electromagnetic protective layer 130.

Figure 13A:
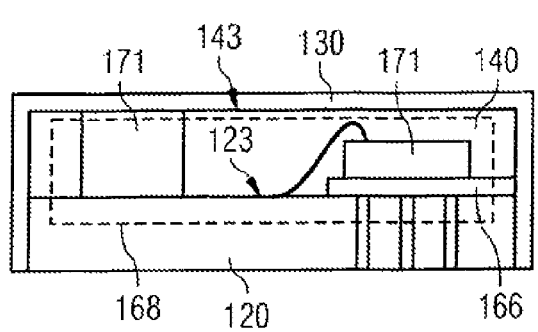
FIGS. 13A and 13B show a schematic illustration of an electronic device in accordance with one embodiment.

FIG. 13A shows a further exemplary embodiment of the device 111. In accordance with the embodiment in FIG. 13A, the component 171 is coupled to the protective layer 130 at the surface 143, such that heat arising during operation in the region 168 is emitted via the component 171 to the electromagnetic protective layer 130. The component 171 is enclosed by the encapsulation 140 at its side faces directed identically to the side faces 141 and 142. The encapsulation and the component 171 have on the substrate the same height as far as the surface 143, such that the protective layer 130 covers both the encapsulation and the component 171.

In accordance with the right-hand part of FIG. 13A, the component 171, which is a component with which contact can be made by wire bonding in the embodiment illustrated here, is thermally coupled to the protective layer 130 via a metallization 166 on the surface 123 of the substrate 120. Heat arising during operation in the component 171 is dissipated from the region 168 via the metallization 166.

Figure 13B:
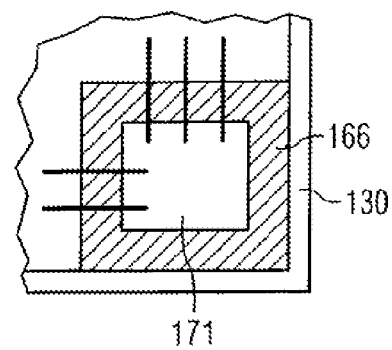

FIG. 13B shows a plan view of the right-hand part of the device from FIG. 13A. The component 171 is arranged on the metallization 166, which is coupled to the protective layer 130, such that heat from the component 171 can be fed to the protective layer 130 via the metallization 166.

Figure 14A:
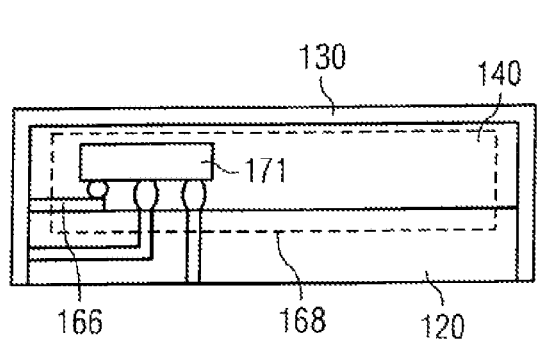
FIGS. 14A and 14B show a schematic illustration of an electronic device in accordance with one embodiment.

FIG. 14A shows a further exemplary embodiment, in which the component 171 is a flip-chip component or an SMD component or a BGA component (SMD: surface-mounted device; BGA: Ball Grid Array). Heat from the component 171 is passed from the region 168 to the protective layer 130 during operation via the coupling of the component 171 to the metallization 166, which is embodied, in particular, as a conductor track. In embodiments, the metallization or conductor track 166 runs in a layer below the surface 123.

Figure 14B:
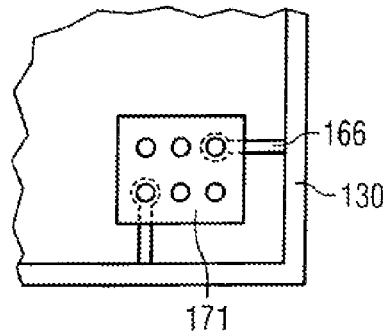

FIG. 14B shows a plan view of the device from FIG. 14A. The component 171 is coupled to the metallization 166, which is in turn coupled to the protective layer 130.

As a result of applying the electromagnetic protective layer after the singulation, only a single singulation step is necessary. Therefore, no additional area for a second or third singulation step along the line 101, for example, need be taken into account on the substrate either. Therefore, electronic devices having small dimensions can be produced by the method according to the application. There is also no need to provide additional contact areas at the top side of the devices on which metallic protective housings might be fixed. This also has the effect that the devices according to the application can be produced in a small fashion.

By virtue of the fact that the protective layer is applied to the devices only at the end of the production of the devices, it is possible in a relatively simple manner to incorporate the application of the protective layer 130 into an already existing production process, since the application of the protective layer follows the complete singulation of the devices. Therefore, it is also possible to maintain existing design specifications for the electronic devices 111, 112, in particular without requiring additional area on the substrate for the electromagnetic shielding in the region 168 or the heat dissipation from the region 168. Compact and reliable devices can thus be formed.

All forms of the described exemplary embodiments for shielding the components among one another and of the exemplary embodiments for heat dissipation from the region 168 can be arranged in any arbitrary combination in the device 111. By way of example, the devices 171 and 172, as explained in connection with FIGS. 10A and 10B, are electromagnetically shielded relative to one another by metal laminae 165. In addition, by way of example, the component 171 is thermally coupled to the protective layer 130 via the conductive material 163, as explained in connection with FIG. 11, in order to dissipate heat. What is common to all these possible combinations is that the electromagnetic protective layer 130 is first applied after the devices have been completely singulated from the panel.

The invention claimed is:

1. A method for producing a plurality of electronic devices, comprising:
    providing an areally extended panel comprising a substrate;
    singulating the panel to form the plurality of electronic devices;
    applying a respective electromagnetic protective layer to the devices of the plurality of electronic devices after singulation, such that the electromagnetic protective layer covers the side faces of the substrate that are exposed by the singulation,
    wherein the electromagnetic protective layer is in each case applied to the devices such that the electromagnetic protective layer in each case completely covers at least one surface of the electronic devices that faces away from the substrate, and
    wherein the electromagnetic protective layer is in each case applied to the devices such that the electromagnetic protective layer in each case covers at least the side faces of the electronic devices that are directed transversely with respect to the at least one surface of the electronic devices, such that a respective region of the side faces of the of the at least one surface of the electronic devices which adjoins an underside situated opposite the at least one surface of the electronic devices is free of the electromagnetic protective layer; and
    forming at least one notch into the substrate in the region prior to applying the electromagnetic protective layer.

2. The method according to claim 1, wherein applying the electromagnetic protective layer comprises:
    sputtering deposition of a partial layer comprising titanium or of a partial layer comprising copper.

3. The method according to claim 1 or 2, wherein applying the electromagnetic protective layer comprises:
    applying a partial layer comprising nickel in an electroless fashion.

4. The method according to claim 1 comprising:
    laser inscription of the panel prior to singulation.

5. The method according to claim 1, comprising:
    plasma cleaning of the plurality of electronic devices prior to applying the protective layer.

6. The method according to claim 1, wherein the electromagnetic protective layer is in each case applied to the devices such that the electromagnetic protective layer in each case completely covers at least the side faces of the electronic devices that are directed transversely with respect to the at least one surface of the electronic devices.

* * * * *